(12) United States Patent
Nishimori et al.

(10) Patent No.: US 6,291,999 B1
(45) Date of Patent: *Sep. 18, 2001

(54) PLASMA MONITORING APPARATUS

(75) Inventors: Yasuhiro Nishimori, Miki; Michio Taniguchi, Kobe; Kazuki Kondo, Izumiotsu, all of (JP)

(73) Assignee: Daihen Corp., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/163,536

(22) Filed: Sep. 30, 1998

(30) Foreign Application Priority Data

Sep. 30, 1997 (JP) .................................. 9-284672

(51) Int. Cl.[7] .................................. G01N 27/62
(52) U.S. Cl. .................................. 324/464
(58) Field of Search .................. 324/95, 638, 464; 216/58, 67, 69; 333/17.3, 99 PL, 124; 73/19.01, 23.2, 35.08

(56) References Cited

U.S. PATENT DOCUMENTS

| | | |
|---|---|---|
| 5,175,472 | 12/1992 | Johnson, Jr. et al. . |
| 5,273,610 | 12/1993 | Thomas, III et al. . |
| 5,467,013 | 11/1995 | Williams et al. . |
| 5,866,985 | * 2/1999 | Coultas et al. ........ 315/111.21 |

* cited by examiner

*Primary Examiner*—Safet Metjahic
*Assistant Examiner*—E P LeRoux
(74) *Attorney, Agent, or Firm*—Scully, Scott, Murphy & Presser

(57) ABSTRACT

A plasma monitoring apparatus for monitoring a condition of plasma of a plasma load to which power is supplied from a high frequency power source through an impedance matcher provides with a first input impedance calculator for calculating an impedance as a first input impedance from a supply-side terminal of the matcher to the plasma load-side based on voltage, current and phase difference detected at the supply-side terminal of the matcher, a second input impedance calculator for calculating an impedance as a second input impedance from a load-side terminal of the matcher to the plasma load based on a impedance of a element of the matcher and the first input impedance and a plasma impedance calculator for calculating an impedance of the plasma load from the second input impedance and an impedance of a supply-side connecting the matcher and the plasma load.

8 Claims, 12 Drawing Sheets

PLASMA MONITORING APPARATUS

BACKGROUND OF THE INVENTION

1. Field of the Invention

The present invention relates to a plasma monitoring apparatus for monitoring the plasma condition of a plasma load supplied from a high frequency power source.

2. Description of the Related Art

Plasma is used for etching, sputtering, thin-film growth, and other plasma processes during the manufacture of semiconductor elements and liquid crystal displays. Plasma processes such as these supply a high frequency current to two electrodes to generate plasma between the electrodes inside the chamber where the specific etching, sputtering, thin-film growth, or other process occurs.

When a high frequency current is supplied to a plasma load in order to generate plasma in this manner, it is important to match the impedance of the high frequency power supply and the plasma load. When the impedances cannot be matched, power reflection at the high frequency supply output terminal inhibits the efficient supply of power to the plasma load. In such cases, good results cannot usually be expected from the plasma process.

It is therefore essential to insert an impedance matching circuit comprising an inductance circuit, capacitance circuit, and transformer between the high frequency supply and the plasma load when supplying power from a high frequency source to a plasma load.

FIG. 11 is a circuit diagram of a typical circuit for supplying power from a conventional high frequency supply to a plasma load. As will be known from the figure, power is supplied from the high frequency supply ("power supply" below) to the plasma load 5 via a coaxial cable 2, impedance matching circuit 3', and a power line 4. A typical impedance matching circuit 3' comprises, for example, a first variable capacitor C11, a coil 11 for adjusting the impedance by selecting a tap, and a second variable capacitor C22. Impedance matching is accomplished by adjusting the capacitance of the first variable capacitor C11 and second variable capacitor C22.

To automatically adjust the first and second variable capacitors C11 and C22, a detector detects the phase difference between the voltage and current on the power supply-side terminal of the impedance matching circuit 3', detects the impedance Zin from the power supply-side terminal of the impedance matching circuit 3' to the plasma load 5 side based on the ratio between the absolute value of the detected voltage and the absolute value of the detected current, and adjusts the capacitors C11 and C22 so that this detected impedance matches the output impedance Zout of the power supply, and the phase difference is zero.

The adjustment matching the impedance Zin to the output impedance Zout of the power supply is accomplished primarily by adjusting the capacitance of the first variable capacitor C11. The adjustment whereby zero phase difference is achieved is accomplished primarily by adjusting the capacitance of the second variable capacitor C22.

The plasma load 5 consists primarily of a chamber 5a, two electrodes 5b1 and 5b2, power supply units 5c1 and 5c2 for supplying current to the impedance matching circuit 3' and the chamber 5a, and power lines 4 connecting the is electrodes 5b1 and 5b2 with the power supply units 5c1 and 5c2. It should be noted that the power line 4 is shown in the chamber 5a, and will be known to also connect the load-side terminal of the impedance matching circuit 3' and the power supply units 5c1 and 5c2.

In plasma processes as described above, it is necessary to constantly monitor the plasma condition in order to achieve good reproducibility and improve the yield of the semiconductor elements being produced. It is also known that the plasma condition can be monitored by measuring the plasma impedance, for example, or the peak-to-peak plasma voltage.

There are two impedances present between the electrodes when plasma is generated when viewed from the load-side terminal of the impedance matching circuit 3' to the plasma load 5 side, that is, the internal resistance of the plasma, and the electrostatic capacitance of the sheaths generated between the plasma and the two electrodes 5b1 and 5b2. There is also impedance in the power line 4 connecting the load-side terminal of the impedance matching circuit 3' and the plasma load 5. It should be noted that it is often not possible to directly connect the load-side terminal of the impedance matching circuit 3' and the power supply units 5c1 and 5c2. A power line 4 of a specific length is used in this case.

An equivalence circuit for the section from the load-side terminal of the impedance matching circuit 3' to the plasma load 5 side when these impedances are present is shown in FIG. 13. Voltage vectors for this equivalence circuit are shown in FIG. 14. Note that VD is the terminal voltage on the load-side terminal of the impedance matching circuit 3'; VL is the power line 4 voltage; VR and VC are the voltage and combined electrostatic capacitance of the sheaths occurring at the internal resistance of the plasma; and VP is the voltage between the electrodes 5b1 and 5b2.

Because it is necessary to detect the voltage VP between the electrodes 5b1 and 5b2, it is usually necessary to pull a lead outside the chamber 5a for detecting this voltage VP. This usually requires modifying the chamber, which is a complicated task. As a result, it is usually the load-side terminal voltage VD of the impedance matching circuit 3' that is detected. The problem with this configuration is that voltage VD is affected by the length of the power line 4, that is, the voltage VL occurring in the power line, and the detected peak-to-peak voltage is therefore imprecise.

For example, a 13.56 MHz power supply is the high frequency supply most commonly used in plasma processes. With such a power supply, the electrostatic capacitance per sheath is 283 pF assuming a dielectric constant in a vacuum of $8.854 \times 10^{-12}$, sheath permittivity of 1, an electrode area of 0.032 m$^2$, and sheath thickness of 1 mm. The combined electrostatic capacitance of the sheaths is therefore approximately 142 pF, and the plasma reactance is $-j82.7\ \Omega$ for a 13.56 MHz supply.

The relative precision of measuring the peak-to-peak voltage VDP for voltage VD, and measuring the peak-to-peak voltage VPP for voltage VP, can be calculated as 100·(VDP−VPP)/VDP (%). Measurements were taken and the precision calculated as described for the following parameters: plasma power supply, 1 kW; 10 Ω internal plasma resistance; and power line inductance of 100 nH, 500 nH, and 1 μH.

At 100 nH, the precision was −11%; at 500 nH, −102%; and at 1 μH, −707%. It will thus be obvious that precision drops as inductance increases.

There is therefore a need for a plasma monitoring apparatus whereby the precision of measuring the inductance or peak-to-peak voltage of the plasma load can be improved when monitoring the plasma condition of the plasma load.

SUMMARY OF THE INVENTION

To meet the above described need, the present invention provides a plasma monitoring apparatus for monitoring the plasma condition of a plasma load to which power is supplied from a high frequency supply through an impedance matching circuit.

A plasma monitoring apparatus according to a first version of the invention for monitoring a plasma condition of a plasma load to which power is supplied from a high frequency source through an impedance matching circuit comprises a voltage detector for detecting a voltage at a load-side terminal of the impedance matching circuit; a current detector for detecting a current at a load-side terminal of the impedance matching circuit; a phase difference detector for detecting a phase difference between the detected voltage and current; a second input impedance calculator for calculating an impedance from a load-side terminal of the impedance matching circuit to the plasma load-side as a second input impedance based on the detected voltage, detected current, and phase difference; and a plasma impedance calculator for calculating an impedance of the plasma load from the second input impedance and an impedance of a power line connecting the load-side terminal of the impedance matching circuit and the plasma load.

A plasma monitoring apparatus according to a further version of the invention further comprises a peak-to-peak plasma voltage calculator for calculating a peak-to-peak voltage of the plasma load from the calculated plasma load impedance and detected current.

Each of these first two versions of the invention improves measurement precision by considering the impedance of the power line, which affects the measurement precision of the impedance and peak-to-peak voltage of the plasma load. Calculation error is also reduced because the voltage and current are detected close to the plasma load.

A plasma monitoring apparatus according to a further version of the invention comprises a voltage detector for detecting a voltage at a load-side terminal of the impedance matching circuit; a current detector for detecting a current at a load-side terminal of the impedance matching circuit; a phase difference detector for detecting a phase difference between the detected voltage and current; a power line load terminal voltage and current calculator for calculating a voltage and current at a load-side terminal of a power line connecting a load-side terminal of an impedance matching circuit and a plasma load based on a detected voltage, detected impedance, and phase difference; and a plasma impedance calculator for calculating an impedance of the plasma load from the load-side terminal voltage and current of the power line.

A plasma monitoring apparatus according to this version of the invention can efficiently measure the impedance of the plasma load because it is not necessary to measure the impedance of the power line. Calculation error is also reduced because because the voltage and current are detected close to the plasma load.

A plasma monitoring apparatus according to a further version of the invention comprises a voltage detector for detecting a voltage at a supply-side terminal of the impedance matching circuit; a current detector for detecting a current at a supply-side terminal of the impedance matching circuit; a phase difference detector for detecting a phase difference between the detected voltage and current; a first input impedance calculator for calculating as a first input impedance an impedance from a supply-side terminal of the impedance matching circuit to the plasma load-side based on the detected voltage, detected current, and phase difference; a second input impedance calculator for calculating as a second input impedance an impedance from a load-side terminal of the impedance matching circuit to the plasma load based on a impedance of a element of the impedance matching circuit and the first input impedance; and a plasma impedance calculator for calculating an impedance of the plasma load from the second input impedance and an impedance of a power line connecting a load-side terminal of an impedance matching circuit and a plasma load.

A further version of this plasma monitoring apparatus further comprises an impedance matching circuit load-side current calculator for calculating a current at a load-side terminal of the impedance matching circuit based on the detected voltage, detected current, and a impedance of a element of the impedance matching circuit; and a peak-to-peak plasma voltage calculator for calculating a peak-to-peak voltage of a plasma load based on an impedance of the plasma load and current at a load-side terminal of the impedance matching circuit.

These two versions of the invention improve measurement precision by considering the impedance of the power line, which affects the measurement precision of the impedance and peak-to-peak voltage of the plasma load. Plasma load impedance and peak-to-peak voltage measurement precision is also improved because the voltage and current are detected close to the plasma load.

A plasma monitoring apparatus according to yet a further version of the invention comprises a voltage detector for detecting a voltage at a supply-side terminal of the impedance matching circuit; a current detector for detecting a current at a supply-side terminal of the impedance matching circuit; a phase difference detector for detecting a phase difference between the detected voltage and current; a first input impedance calculator for calculating as a first input impedance an impedance from a supply-side terminal of the impedance matching circuit to the plasma load-side based on the detected voltage, detected current, and phase difference; a second input impedance calculator for calculating as a second input impedance an impedance from a load-side terminal of the impedance matching circuit to the plasma load based on a impedance of a element of the impedance matching circuit and the first input impedance; an effective power calculator for calculating the effective power of the high frequency supply from the detected voltage, detected current, and phase difference; an impedance matching circuit load terminal voltage and current calculator for calculating a voltage and current at a load-side terminal of the impedance matching circuit based on the second input impedance and effective power; a power line load terminal voltage and current calculator for calculating a voltage and current at a load-side terminal of a power line connecting a load-side terminal of an impedance matching circuit and a plasma load based on the calculated voltage and current at a load-side terminal of the impedance matching circuit; and a plasma impedance calculator for calculating an impedance of the plasma load from the load-side terminal voltage and current of the power line.

This plasma monitoring apparatus may further comprise a peak-to-peak plasma voltage calculator for calculating a peak-to-peak voltage of a plasma load based on a voltage at a load-side terminal of the power line.

A plasma monitoring apparatus according to this version of the invention can efficiently measure the impedance of the plasma load because it is not necessary to measure the impedance of the power line. Measurement precision of the peak-to-peak plasma voltage is also improved because the voltage and current are detected where high precision detection is possible.

BRIEF DESCRIPTION OF THE DRAWINGS

These and other objects and features of the present invention will be readily understood from the following detailed description taken in conjunction with preferred embodiments thereof with reference to the accompanying drawings, in which like parts are designated by like reference numerals and in which:.

DESCRIPTION OF THE PREFERRED EMBODIMENTS

The preferred embodiments of the present invention are described below with reference to the accompanying figures.

Embodiment 1

Figure 1:
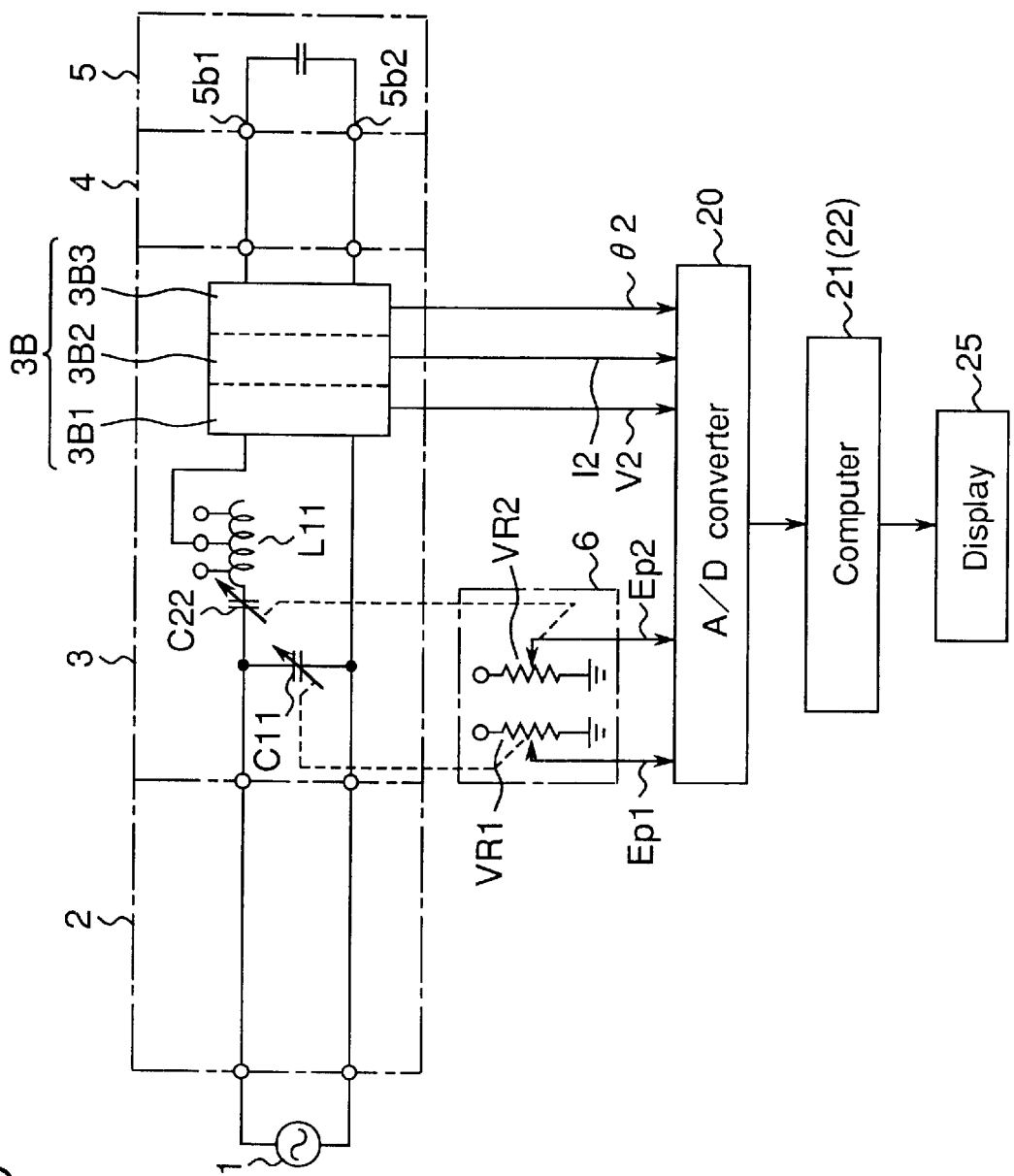
FIG. 1 is a circuit diagram of a plasma monitoring apparatus according to a first embodiment of the present invention.

FIG. 1 is a circuit diagram of a plasma monitoring apparatus according to a first embodiment of the present invention. Shown in the figure are a power supply 1, coaxial cable 2, impedance matching circuit 3 (matcher 3 below), power line 4, and a plasma load 5 (simply "load" below).

As shown in FIG. 1, this matcher 3 comprises a first variable capacitor C11, a coil L11 for adjusting the impedance by selecting a tap, and a second variable capacitor C22. The adjustment means (operating spindle) for adjusting the capacitance of the first and second variable capacitors C11 and C22 is linked to a motor-driven operating mechanism, not shown in the figures. A controller (not shown in the figures) for controlling the motors driving the operating elements of the variable capacitors is provided. The capacitance of the variable capacitors is adjusted by controlling the rotation of the operating element of the first and second variable capacitors C11 and C22.

A load-side detector 3B is provided at the load-side terminal of the matcher 3. This load-side detector 3B comprises a voltage detector 3B1 for detecting a load-side terminal voltage V2; a current detector 3B2 for detecting a load-side terminal current I2; and a phase difference detector 3B3 for detecting a phase difference $\theta 02$ between the current I2 and voltage V2.

Note that below the capacitance of the first and second variable capacitors C11 and C22 in the matcher 3 are denoted as capacitances C1 and C2, and the inductance of the coil L11 is denoted as L1. Furthermore, while inductance L1 is known, the capacitances C1 and C2 of the first and second variable capacitors C11 and C22, which are the means for adjusting the impedance, vary. Therefore, to calculate capacitances C1 and C2, variable resistors VR1 and VR2 are provided, and a slider for adjusting these variable resistors VR1 and VR2 is linked to the drive mechanism for the variable capacitor operator in order to link operation of variable resistors VR1 and VR2 to the first and second variable capacitors C11 and C22.

An adjustment position detector 6 for detecting the position of the adjustment part of the impedance adjustment means is formed by the variable resistors VR1 and VR2. A constant current voltage is applied to both variable resistors VR1 and VR2 to detect position detection signals Ep1 and Ep2. These position detection signals Ep1 and Ep2 correspond to the position (angle of rotation) of the operators of the first and second variable capacitors C11 and C22 between the ground and sliders of the variable resistors VR1 and VR2.

The detected voltage V2, detected current I2, phase difference $\theta 2$, and position detection signals Ep1 and Ep2, are input to an analog/digital (A/D) matcher 20 for conversion to digital signals, and these digital signals are then supplied to a computer 21.

The computer 21 calculates the plasma impedance and peak-to-peak voltage, and displays the results on display 25.

Figure 2:
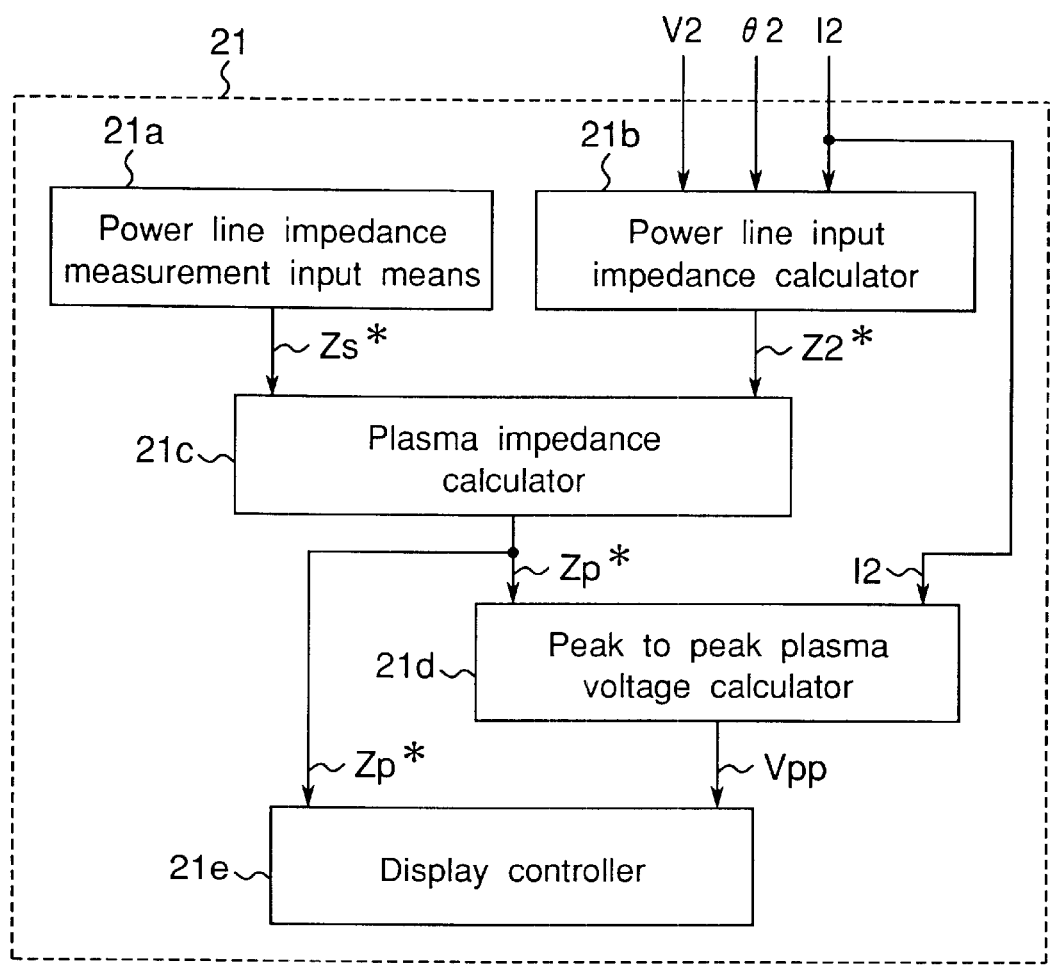
FIG. 2 is a block diagram showing the internal functions of the computer in the plasma monitoring apparatus according to a first embodiment of the invention.

FIG. 2 is a block diagram showing the internal functions of the computer 21 in an exemplary plasma monitoring apparatus 1 according to the present embodiment of the invention.

The computer 21 comprises a power line impedance measurement input means 21a, a power line input impedance calculator 21b, a plasma impedance calculator 21c, a peak-to-peak plasma voltage calculator 21d, and a display controller 21e.

The measured impedance values Zs* of the power line 4 are input to the computer 21 through the power line impedance measurement input means 21a. The power line input impedance calculator 21b calculates an input impedance value Z2* of the power line 4 from detected voltage V2, detected current I2, and phase difference $\theta 2$. The plasma impedance calculator 21c calculates impedance values ZP* of the plasma load 5 from the measured impedance values Zs* of the power line 4 and input the power line impedance values Z2* (second input impedance). The peak-to-peak plasma voltage calculator 21 d calculates a peak-to-peak voltage VPP of the plasma load from the detected current I2 and the impedance values ZP* of the plasma load. The display controller 21e controls displaying the resulting plasma load impedance values ZP* and peak-to-peak voltage VPP. Note that the asterisk (*) used herein indicates a plurality of values.

Figure 3:
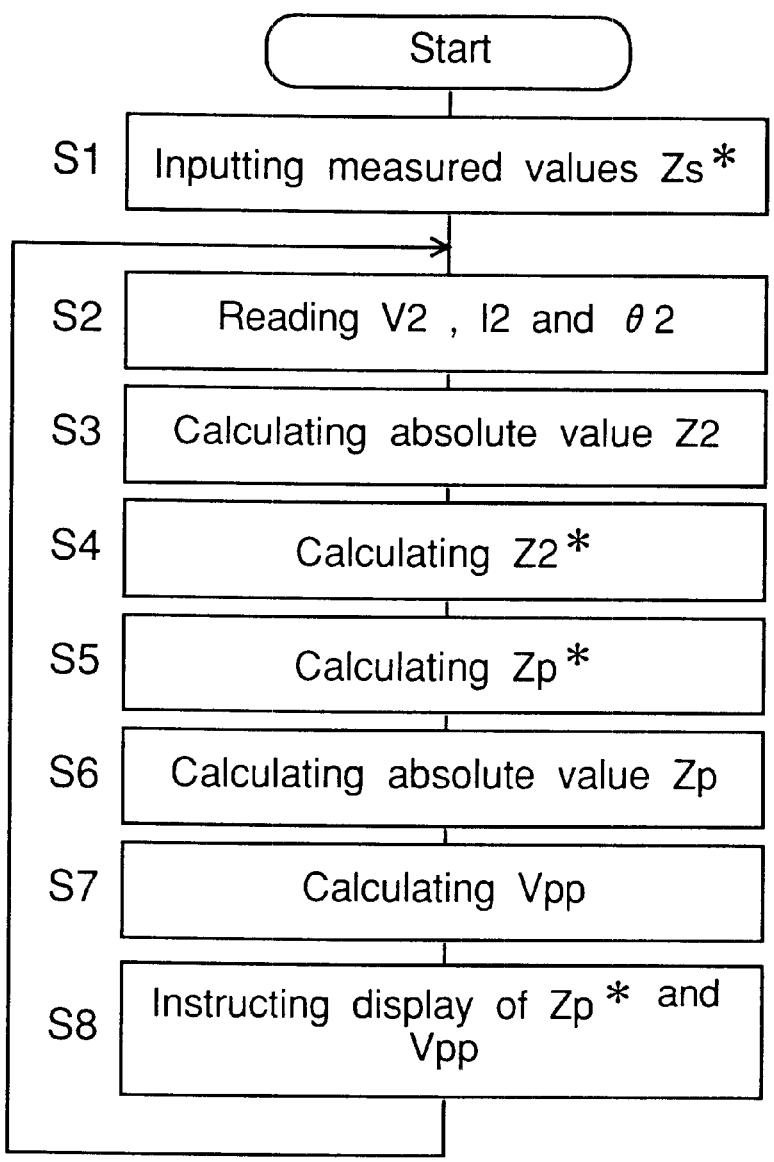
FIG. 3 is a flow chart used to describe the algorithm of a program run by the computer of the first embodiment.

FIG. 3 is a flow chart used to describe the algorithm of a program run by the computer of the first embodiment described above.

This program starts with the power line impedance values Zs* measured by an impedance analyzer being input to the power line impedance measurement input means 21a (step S1). It should be noted that this power line can be treated as having no resistance and a reactance of inductance LS only. Impedance is measured by shorting electrodes 5b1 and 5b2.

The power line input impedance calculator 21b then reads the detected voltage V2, detected current I2, and phase difference θ2 from the load-side detector 3B (step S2). It then calculates the absolute value Z2 of the input impedance using detected voltage V2 and detected current I2 by applying the following equation 1 where the impedance from the load-side terminal of the matcher 3 to the plasma load 5 side, that is, the impedance seen from the power supply terminal of the power line 4 to the load-side, is defined as the power line input impedance Z2* (step S3).

$$Z2 = V2/I2 \tag{1}$$

The power line input impedance Z2* is then obtained from the absolute impedance value Z2 and the phase difference θ2 (step S4). If the resistance component of this impedance Z2* is R2, the reactance is X2, be obtained from the following equations (2) and (3).

$$R2 = Z2 \cdot \cos\theta2 \tag{2}$$

$$X2 = Z2 \cdot \sin\theta2 \tag{3}$$

The plasma impedance calculator 21c calculates the impedance from the load-side terminal of the power line 4 to the load-side as plasma impedance ZP* using the above calculated resistance R2, reactance X2, and power line reactance ωLs (ω: angular frequency) (step S5). If RP is the resistance component of impedance ZP*, XP is the reactance component, and ZP*=RP+jXP, RP and XP can be obtained from the following equations (4) and (5).

$$RP = R2 \tag{4}$$

$$XP = X2 - \omega Ls \tag{5}$$

The peak-to-peak plasma voltage calculator 21d then calculates the absolute value ZP of the plasma impedance from the RP and XP values from equations (4) and (5) using equation (6) (step S6).

$$ZP = \{R2 + (X2 - \omega Ls)^2\}^{1/2} \tag{6}$$

The peak-to-peak plasma voltage VPP is then calculated from the detected current I2 and absolute impedance value ZP using equation (7). Note that I2 is the effective value.

$$VPP = 2 \cdot 2^{1/2} \cdot I2 \cdot ZP \tag{7}$$

The display controller 21e then outputs a command for displaying the plasma impedance values ZP* and peak-to-peak plasma voltage VPP (step S8), and the procedure loops back to step S2.

Embodiment 2

Figure 4:
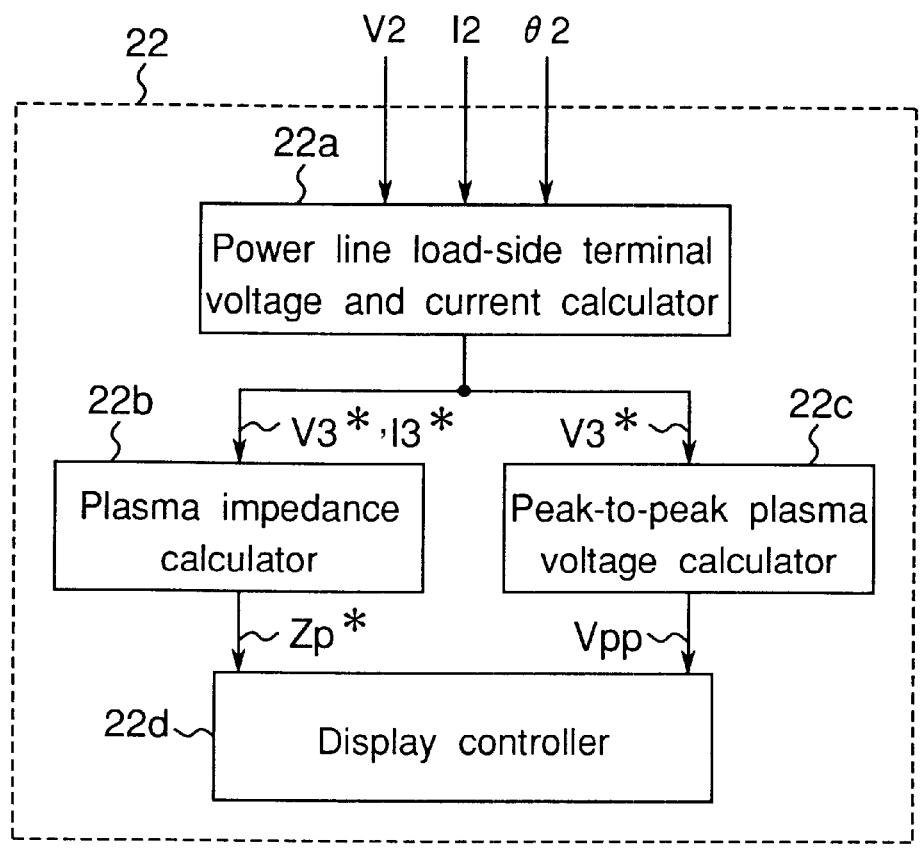
FIG. 4 is a block diagram showing the internal functions of the computer in the plasma monitoring apparatus according to a second embodiment of the invention.

FIG. 4 is a block diagram of the internal functions of a computer in a plasma monitoring apparatus according to a second embodiment of the present invention. It should be noted that a circuit diagram for this second embodiment is identical to that of the first, and is therefore omitted.

This computer 22 has a power line load-side terminal voltage and current calculator 22a, plasma impedance calculator 22b, peak-to-peak plasma voltage calculator 22c, and display controller 22d.

The power line load-side terminal voltage and current calculator 22a calculates load-side terminal voltage V3* and current I3* of the power line 4 from the detected voltage V2, detected current I2, and phase difference θ2.

The plasma impedance calculator 22b calculates the impedance ZP* of the plasma load 5 from the power line load-side terminal voltage V3* and current I3*.

The peak-to-peak plasma voltage calculator 22c calculates a plasma load peak-to-peak voltage VPP from the power line load-side terminal voltage V3*.

The display controller 22d displays the plasma load impedances ZP* and peak-to-peak voltage VPP.

Figure 5:
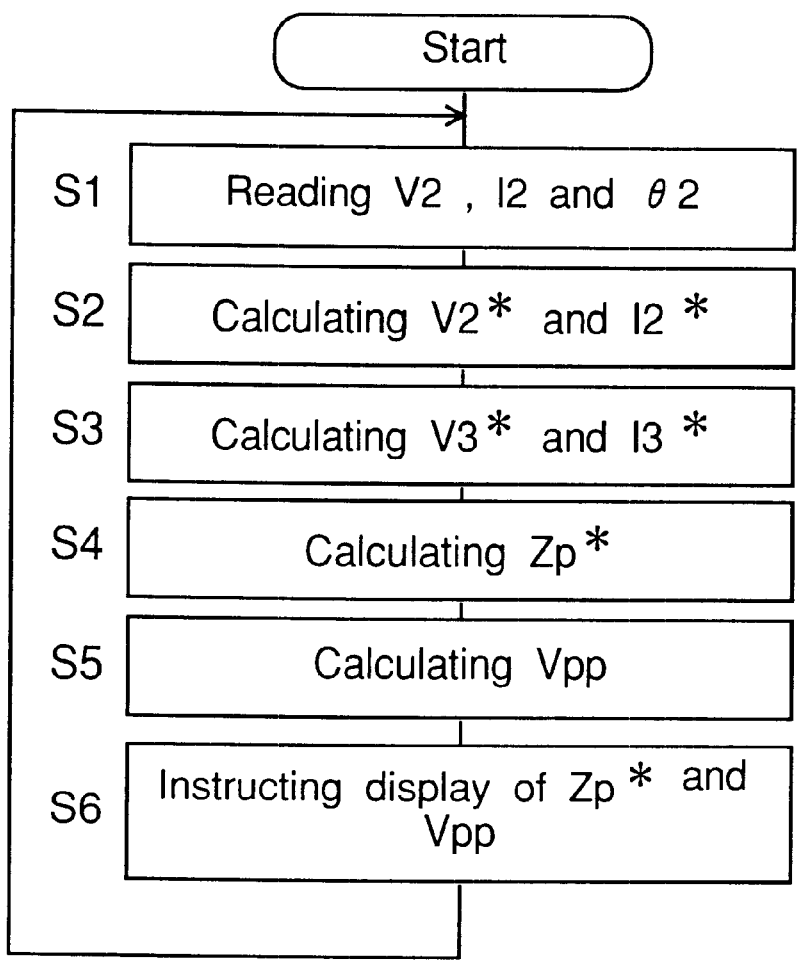
FIG. 5 is a flow chart used to describe the algorithm of a program run by the computer of the second embodiment.

FIG. 5 is a flow chart used to describe the algorithm of a program run by the computer of the second embodiment of the invention described above.

This program starts with the power line load-side terminal voltage and current calculator 22a reading the detected voltage V2, detected current I2, and phase difference θ2 output signals from the load detector 3B (step S1) from which it calculates the power supply-side terminal voltage V2* and current I2* of the power line (step S2). Assuming that V2 and I2 are effective values, V2* and I2* can be obtained from the following equations.

$$V2^* = 2^{1/2} \cdot V2 \varepsilon^{j\omega t} \tag{8}$$

$$I2^* = 2^{1/2} \cdot I2 \varepsilon^{j(\omega t - \theta 2)} \tag{9}$$

If the power line 4 is assumed to be a four terminal network, the load-side terminal voltage V3* and current I3* are obtained (step S3). Voltage V2* and current I2* can be further expressed by the following equation 10 where A2, B2, C2, and D2 are the four terminal constants, and V3* and I3* are the load-side terminal voltage and current as calculated above.

$$\begin{bmatrix} V2^* \\ I2^* \end{bmatrix} = \begin{bmatrix} A2 & B2 \\ C2 & D2 \end{bmatrix} \begin{bmatrix} V3^* \\ I3^* \end{bmatrix} \tag{10}$$

Equation 10 can be restated as equation 11 below by multiplying V2* and I2* by an inverse matrix of the four terminal constatns.

$$\begin{bmatrix} V3^* \\ I3^* \end{bmatrix} = \frac{1}{A2D2 - B2C2} \begin{bmatrix} D2 & -B2 \\ -C2 & A2 \end{bmatrix} \begin{bmatrix} V2^* \\ I2^* \end{bmatrix} \tag{11}$$

The load-side terminal voltage V3* and current I3* of the power line can then be obtained from equations (12) and (13) using equation (11).

$$V3^* = \{1/(A2 \cdot D2 - B2 \cdot C2)\}(D2 \cdot V2^* - B2 \cdot I2^*) \tag{12}$$

$$I3^* = \{1/(A2 \cdot D2 - B2 \cdot C2)\}(-C2 \cdot V2^* + A2 \cdot I2^*) \tag{13}$$

Using the resulting load-side terminal voltage V3* and current I3* of the power line, the plasma impedance calculator 22b then calculates the plasma impedance ZP* from equation (14) (step S4).

$$ZP^* = V3^*/I3^* \tag{14}$$

The peak-to-peak plasma voltage calculator 22c then obtains the maximum value V3'* among the V3* values calculated from equation (12), and calculates the peak-to-peak plasma voltage VPP from equation (15) (step S5).

$$VPP = 2 \cdot V3'^* \tag{15}$$

The display controller 22d then issues a command for displaying the resulting plasma impedance ZP* and peakto-peak plasma voltage VPP (step S6). The procedure then returns to step S1.

The four terminal constants A2, B2, C2, and D2 can be obtained using a method as described below.

First, a resistor R with a known resistance is connected between electrodes 5b1 and 5b2 (see FIG. 1), and the impedance Z22 from the power supply-side of the power line 4 to the load-side is measured with an impedance analyzer.

A high frequency signal source with a known voltage is then connected to the power supply-side terminal of the power line 4, and the input voltage V22 and output voltage V33 (the voltage between the terminals) are measured. If the input current is I22 and the output current is I33, V22 and I22 can expressed by equation (16) using the four terminal constants A2, B2, C2, and D2, and the output voltage V33 and output current I33.

$$\begin{bmatrix} V22 \\ I22 \end{bmatrix} = \begin{bmatrix} A2 & B2 \\ C2 & D2 \end{bmatrix} \begin{bmatrix} V33 \\ I33 \end{bmatrix} \quad (16)$$

Because I22=V22/Z22 and I33=V33/R, equation (16) can be restated in the form of equation (17).

$$\begin{bmatrix} V22 \\ V22/Z22 \end{bmatrix} = \begin{bmatrix} A2 & B2 \\ C2 & D2 \end{bmatrix} \begin{bmatrix} V33 \\ V33/R \end{bmatrix} \quad (17)$$

Equation (17) can then be expanded to equations (18) and (19) below.

$$V22=(A2+B2/R)V33 \quad (18)$$

$$V22/Z22=(C2+D2/R)V33 \quad (19)$$

If Z2a is the impedance, V2a is the input voltage, and V3a is the output voltage when resistance Ra is connected, and Z2b is the impedance, V2b is the input voltage, and V3b is the output voltage when resistance Rb is connected in equations (18) and (19), the following system of equations (20) is obtained.

$$V2a=(A2+B2/Ra)V3a$$

$$V2a/Z2a=(C2+D2/Ra)V3a$$

$$V2b=(A2+B2/Rb)V3b$$

$$V2b/Z2b=(C2+D2/Rb)V3b \quad (20)$$

The four terminal constants A2, B2, C2, and D2 can then be obtained from equation (20).

$$A2=\{1/(Rb-Ra)\}(V2a/V3a)\cdot Ra+(V2b/V3b)\cdot Rb \quad (21)$$

$$B2=\{(V2a/V3a)-(V2b/V3b)\}\cdot Ra\cdot\{1/(Rb-Ra)\}\cdot Rb \quad (22)$$

$$C2=\{1/(Rb-Ra)\}(-V2a/V3a\cdot Z2a)\cdot Ra+(V2b/V3b\cdot Z2b)\cdot Rb \quad (23)$$

$$D2=\{(V2a/V3a\cdot Z2a)-(V2b/V3b\cdot Z2b)\}\cdot Ra\cdot\{1/(Rb-Ra)\}\cdot Rb \quad (24)$$

Embodiment 3

Figure 6:
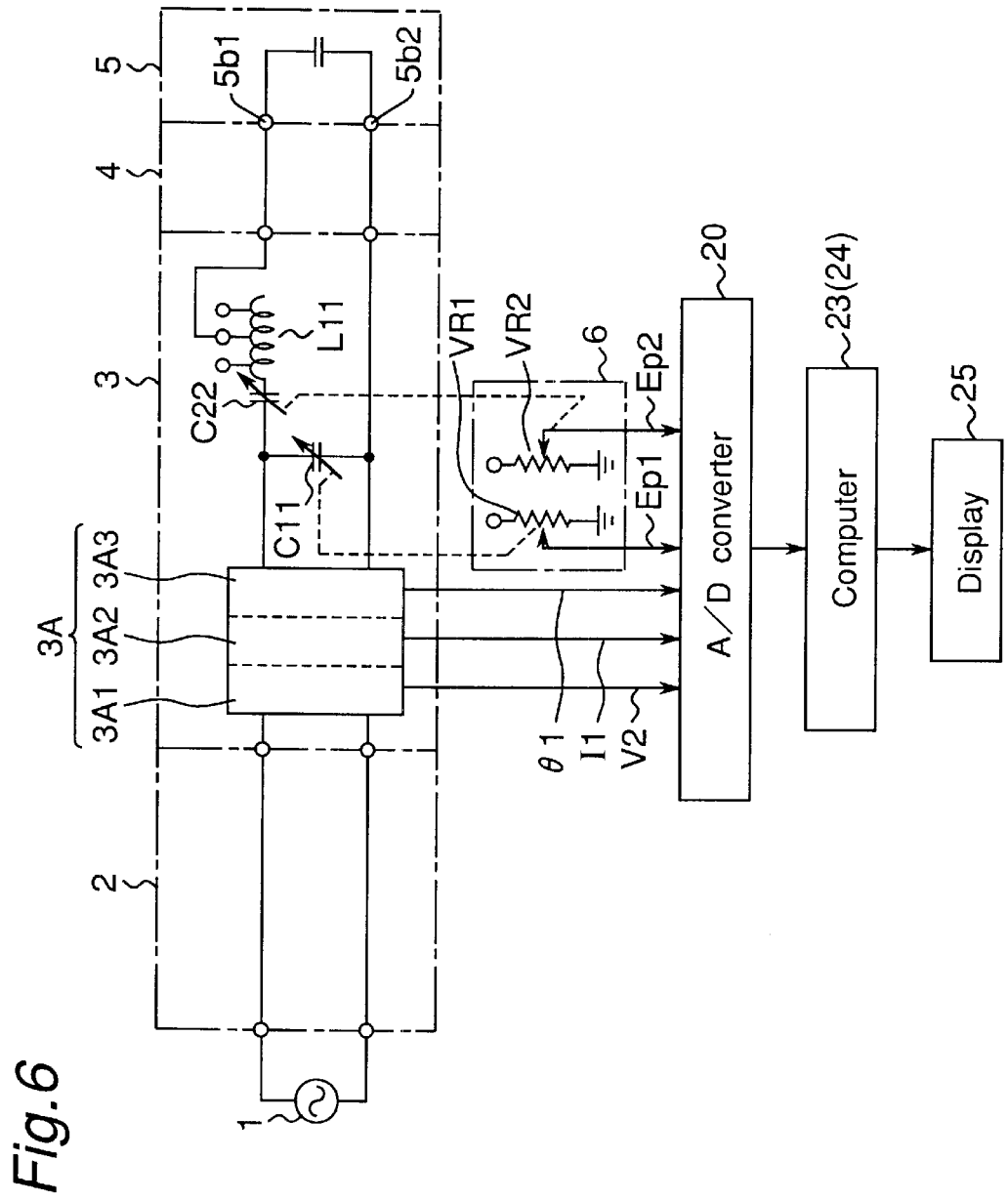
FIG. 6 is a circuit diagram of a plasma monitoring apparatus according to a third embodiment of the present invention.

FIG. 6 is a circuit diagram of a plasma monitoring apparatus according to a third embodiment of the present invention. Shown in the figure are a power supply 1, coaxial cable 2, impedance matching circuit 3 (matcher 3 below), power line 4, a plasma load 5, A/D matcher 20, computer 23, and display 25.

Note that the matcher 3 comprises on the power supply-side thereof a power supply-side detector 3A. This power supply-side detector 3A comprises a voltage detector 3A1, a current detector 3A2, and a phase difference detector 3A3.

The voltage detector 3A1 detects the supply-side terminal voltage V1. The current detector 3A2 detects the supply-side terminal current I1. The phase difference detector 3A3 detects a phase difference θ1 of the voltage V1 and current I1.

Figure 7:
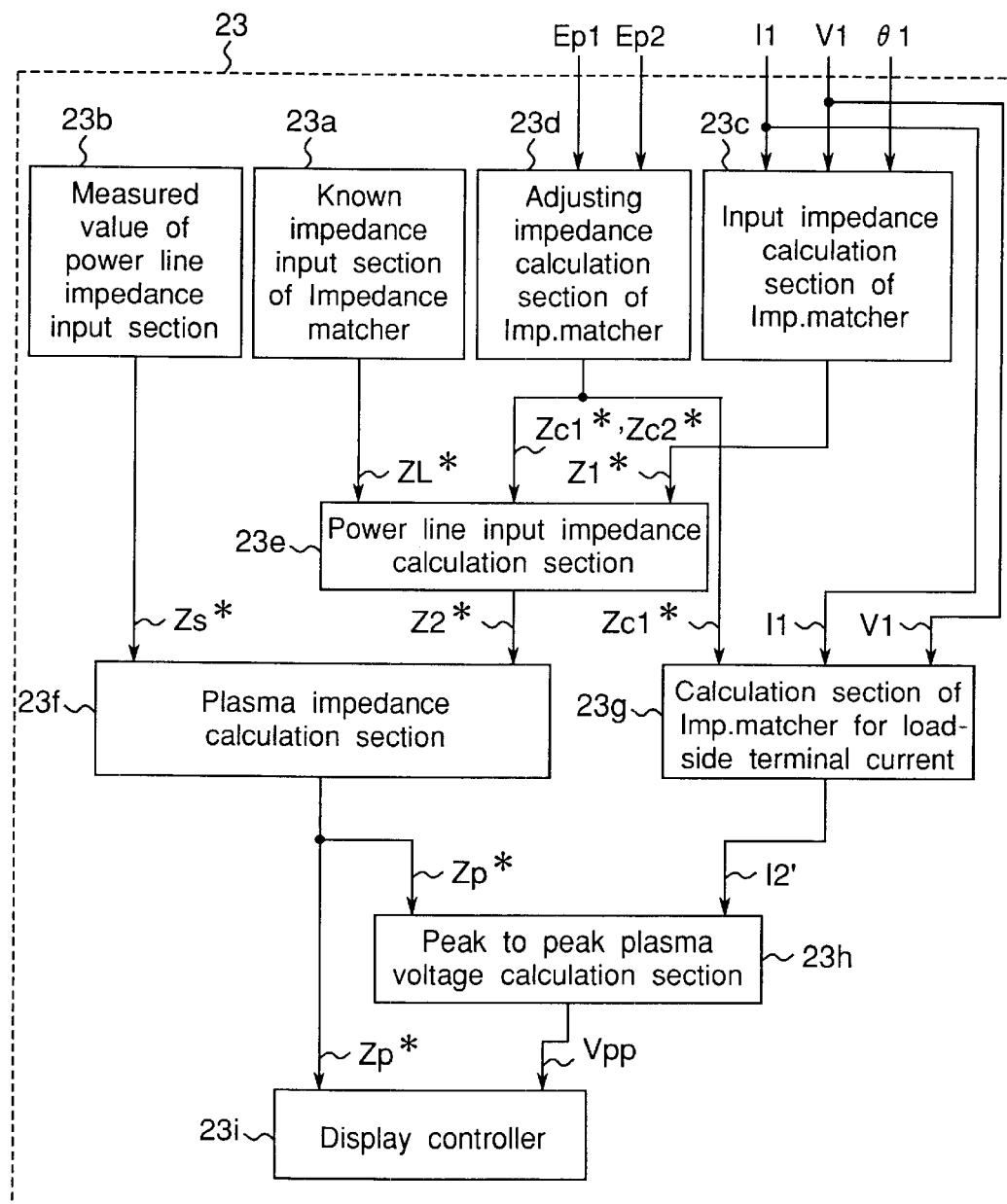
FIG. 7 is a block diagram showing the internal functions of the computer in the plasma monitoring apparatus according to a third embodiment of the invention.

FIG. 7 is a block diagram showing the internal functions of the computer 23 in an exemplary plasma monitoring apparatus 1 according to the present embodiment of the invention.

The computer 23 provides with a known impedance input section 23a for inputting a known impedance ZL* and a measured value input section 23b for inputting a measured impedance of power line 4 which constitute portions of the matcher 3. Further, it provides with an input impedance calculation section 23c for calculating an input impedance Z1* of the matcher 3 from the detected voltage V1, detected current I1 and phase difference θ1 and an adjusting impedance calculation section 23d, as a part of the matcher 3, for calculating adjusting impedances ZC1* and ZC2* from position detection signals EP1 and EP2.

The computer 23 further comprises:

a power line input impedance calculation section 23e for calculating an input impedance Z2* (second input impedance) of the power line 4 from the known impedance ZL* of the matcher 3, input impedance Z1* and adjusting impedance ZC1* and ZC2*;

a plasma impedance calculation section 23f for calculating an impedance ZP* of the plasma load from the power line impedance ZS* and input impedance Z2*;

a load-side terminal current calculation section 23g for calculating a current I2' at the load-side terminal of the matcher from the detected voltage V1, detected current I1 and adjusting impedance ZC1, a peak-to-peak plasma voltage calculation section 23h for calculating a peak-to-peak voltage VPP of the plasma load from the plasma load impedance ZP* and load-side terminal current I2' of the matcher; and a display controller 23i for displaying the plasma load impedance ZP* and the peak-to-peak voltage VPP.

Figure 8:
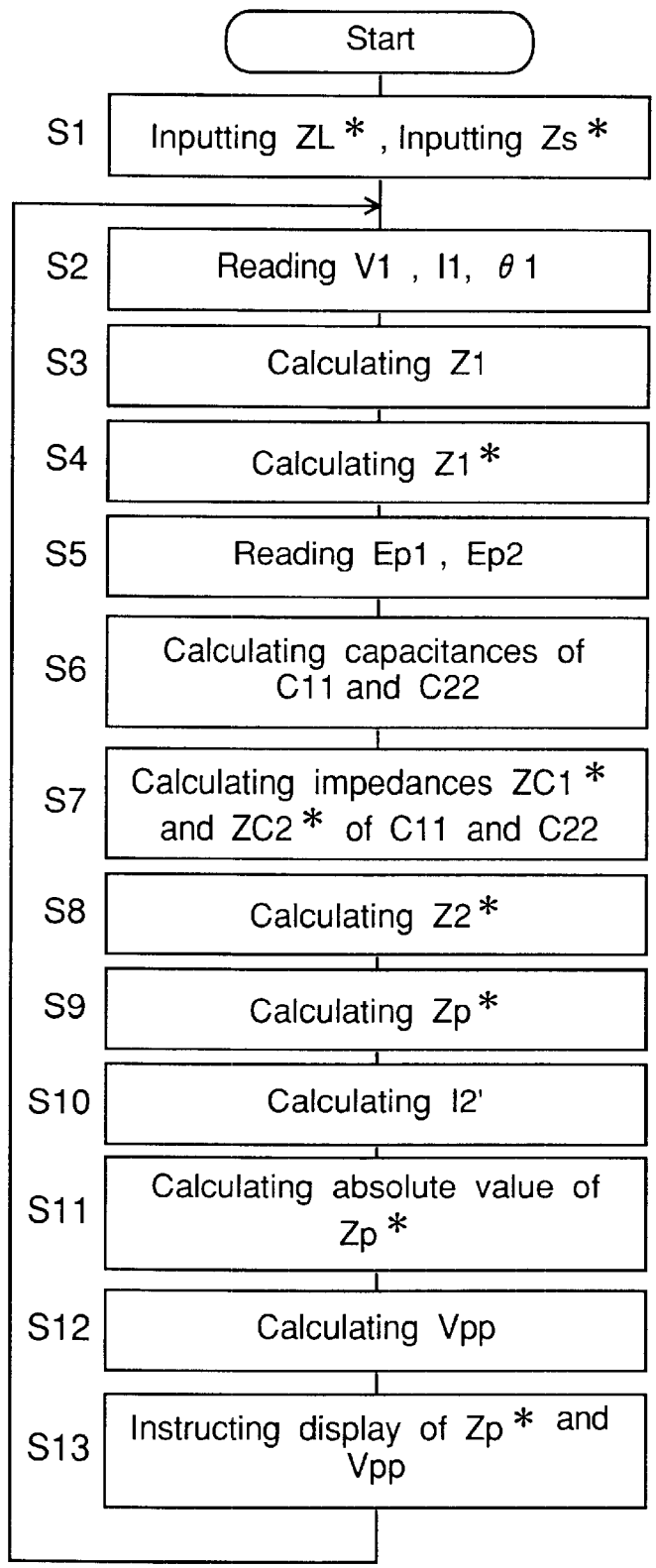
FIG. 8 is a flow chart used to describe the algorithm of a program run by the computer of the third embodiment.

FIG. 8 is a flow chart used to describe the algorithm of a program run by the computer of the third embodiment described above.

Reactance ωL1 (ω: angular frequency) is input to the known impedance input section 23a as the known impedance ZL* of the known inductance L1 of the selected tap, and the reactance ωLs is input as the measured power line impedance ZS* to the measured impedance input section 23b (step S1).

The matcher input impedance calculation section 23c then reads the detected voltage V1, detected current I1, and phase difference θ1 signals output from the power supply-side detector 3A (step S2). Next, the absolute value Z1 of the input impedance is obtained from the detected voltage V1 and detected current I1 using equation (25) where input impedance Z1*(first input impedance) to the matcher 3 is the impedance from the power supply-side terminal to the load-side of the matcher 3 (step S3).

$$Z1=V1/I1 \quad (25)$$

Next, the matcher input impedance Z1* is obtained from the phase difference θ1 and the absolute value Z1 of the above impedance (step S4). If the resistance component of this input impedance Z1* is R1, the reactance is X1, and Z1*=R1+jX1, R1 and X1 are obtained from equations (26) and (27).

$$R1 = Z1 \cdot \cos\theta 1 \quad (26)$$

$$X1 = Z1 \cdot \sin\theta 1 \quad (27)$$

The adjustment impedance calculation section 23d then reads the position detection signals Ep1 and Ep2 output from the adjustment position detector 6 (step S5), and the capacitance C1 and C2 of the first and second variable capacitors C11 and C22 is then calculated from the position detection signals (step S6). Based on the results, the reactance XC1 and XC2 of the first and second variable capacitors C11 and C22 is then obtained (step S7).

The power line input impedance calculation section 23e calculates the impedance from the load-side terminal of the matcher 3 to the plasma load 5 side, that is, from the power supply-side terminal of the power line to the load-side, as power line input impedance Z2* (step S8).

If this input impedance Z2*=R2+jX2 where R2 and X2 are unknown values, and resistance R1 and reactance X1 of the input impedance Z1*, and reactance XC1, XC2, and XL1 of the matcher 3 are known values, R2 and X2 are then obtained from equations (28) and (29).

$$R2=R1 \cdot (XC1)^2/B \quad (28)$$

$$X2=\{R1^2 \cdot XC1+(X1+XC1) \cdot XC1 \cdot X1\}/B+(XC2-XL1) \quad (29)$$

where B =R1²+(X1+XC1)².

The plasma impedance calculation section 23f calculates the impedance from the load-side terminal of the power line 4 to the load-side as plasma impedance ZP* using the above calculated resistance R2, reactance X2, and power line reactance ωLs as in the first embodiment above using equations (4) and (5) (step S9)

The matcher load-side current calculation section 23g calculates the load-side terminal current I2' of the matcher 3 using equation (30) based on the detected voltage V1, detected current I1, and reactance XC1 of the first variable capacitor C11 (step S10). Note that I1 and V1 are the effective values.

$$I2'=I1-XC1 \cdot V1 \quad (30)$$

The peak-to-peak plasma voltage calculation section 23h then calculates the absolute value ZP of the plasma impedance from the RP and XP values using equation (6) (step S11).

The peak-to-peak plasma voltage VPP is then calculated from the load-side terminal current I2' and absolute impedance value ZP using equation (31) (step S12).

$$VPP=2 \cdot 2^{1/2} \cdot I2' \cdot ZP \quad (31)$$

The display controller 23i then outputs a command for displaying the plasma impedance values ZP* and peak-to-peak plasma voltage VPP (step S13), and the procedure loops back to step S2.

Embodiment 4

Figure 9:
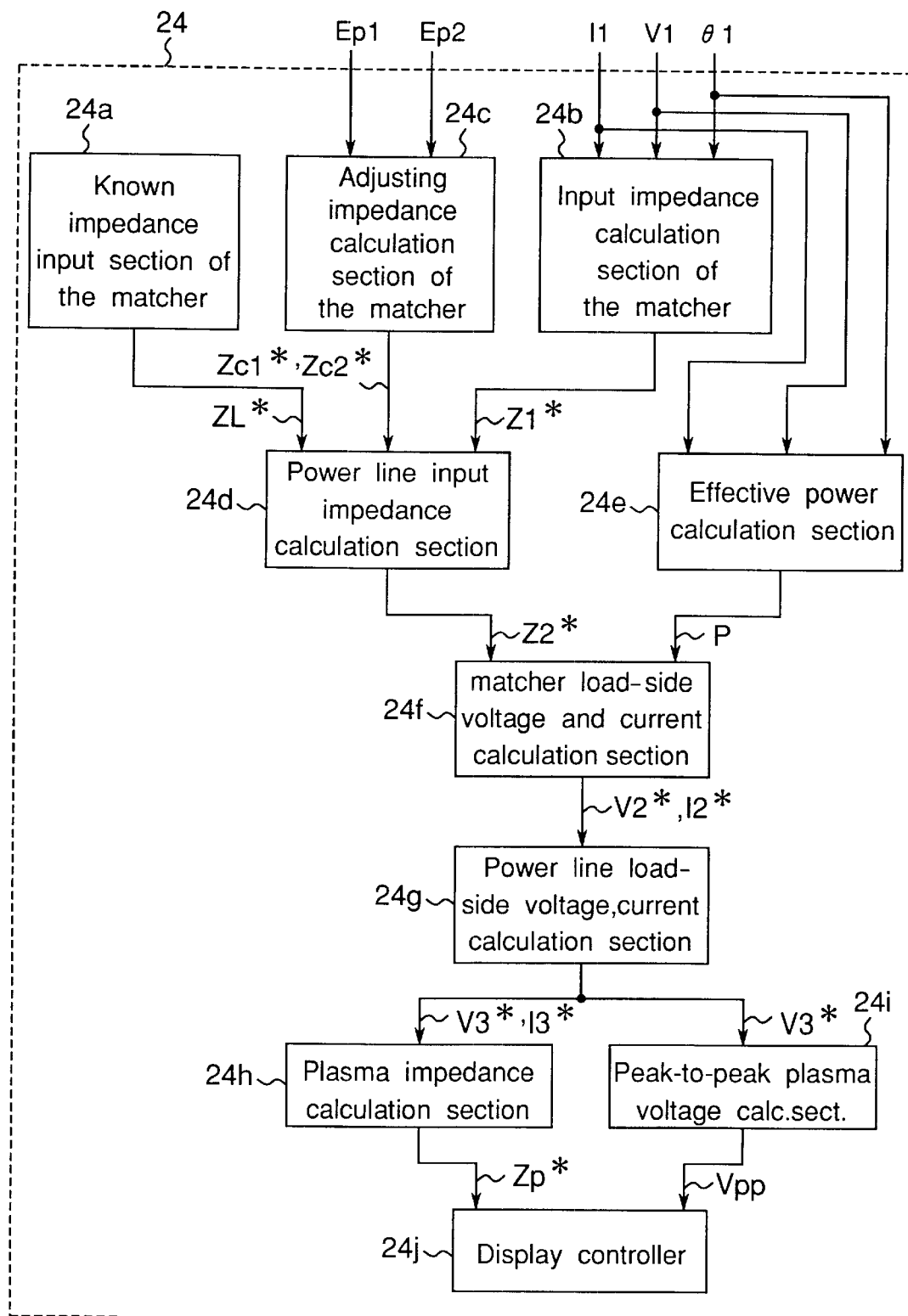
FIG. 9 is a block diagram showing the internal functions of the computer in the plasma monitoring apparatus according to a fourth embodiment of the invention.

FIG. 9 is a block diagram of the internal functions of a computer in a plasma monitoring apparatus according to a fourth embodiment of the present invention. It should be noted that a circuit diagram for this embodiment is identical to that of the third, and is therefore omitted.

As will be known from FIG. 9, this computer 24 comprises a known impedance input section 24a of the matcher, a matcher input impedance calculation section 24b of the matcher, an adjustment impedance calculation section 24c, a power line input impedance calculation section 24d, an effective power calculation section 24e, a load-side current and voltage calculation section 24f of the matcher, a power line load-side current and voltage calculation section 24g, a plasma impedance calculation section 24h, a peak-to-peak plasma voltage calculation section 24i, and a display controller 24j.

The known impedance ZL* of the matcher 3 is supplied to the computer 23 through the known impedance input section 24a.

The matcher input impedance calculation section 24b calculates the input impedance Z1* of the matcher 3 based on a detected voltage V1, detected current I1, and phase difference θ1.

The adjustment impedance calculation section 24c calculates the adjustment impedance values ZC1* and ZC2* of the matcher 3 from position detection signals Ep1 and Ep 2.

The power line input impedance calculation section 24d calculates the power line input impedance Z2* (second input impedance) from the known impedance ZL*, input impedance Z1*, and adjustment impedance values ZC1* and ZC2*.

The effective power calculation section 24e calculates the effective power P of high frequency supply 1 from the detected voltage V1, detected current I1, and phase difference θ1.

The matcher load-side current and voltage calculation section 24f calculates the load-side terminal voltage V2* and current I2* of the matcher 3 from the power line input impedance Z2* and effective power P.

The power line load-side current and voltage calculation section 24g calculates the load-side terminal voltage V3* and current I3* of the power line 4 from the load-side terminal voltage V2* and current I2*.

The plasma impedance calculation section 24h calculates the plasma load impedance ZP* from the load-side terminal voltage V3* and current I3* of the power line 4.

The peak-to-peak plasma voltage calculation section 24i then calculates the peak-to-peak plasma voltage VPP from the load-side terminal voltage V3* of the power line 4.

The display controller 24j displays the final plasma load impedance ZP* and peak-to-peak voltage VPP.

Figure 10:
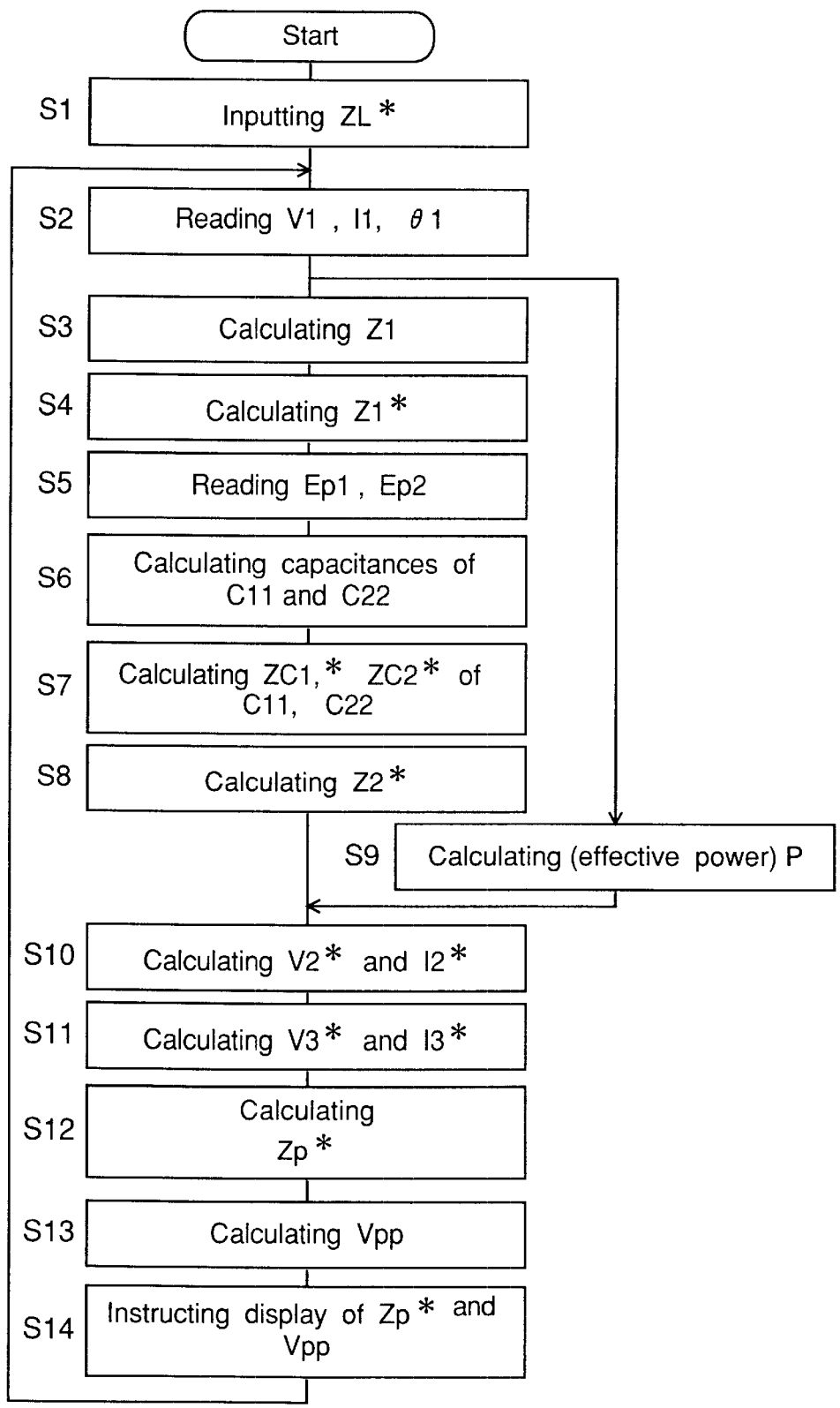
FIG. 10 is a flow chart used to describe the algorithm of a program run by the computer of the fourth embodiment.
Figure 11:
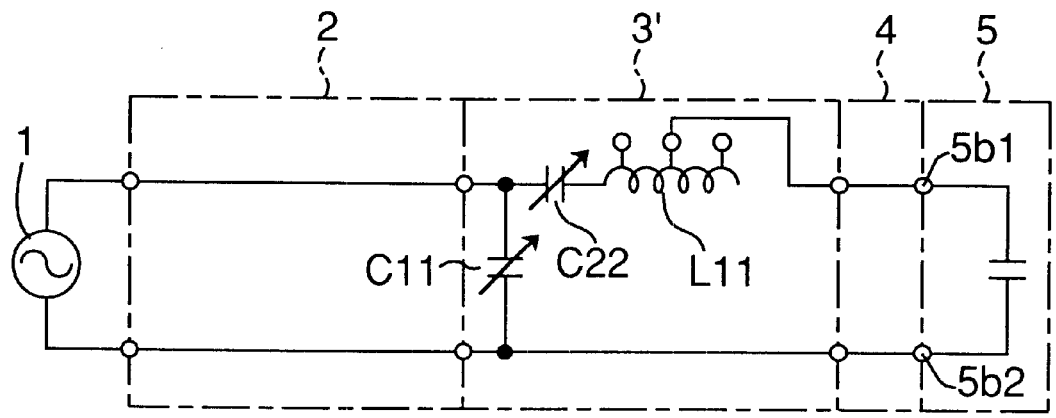
FIG. 11 is a typical circuit diagram of a circuit for supplying power from a high frequency supply to a plasma load.
Figure 12:
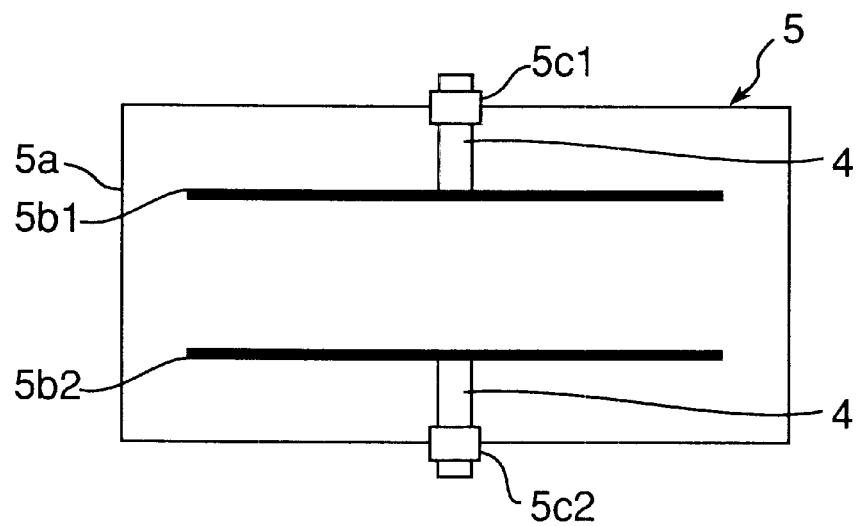
FIG. 12 is a typical illustration of the plasma load.
Figure 13:
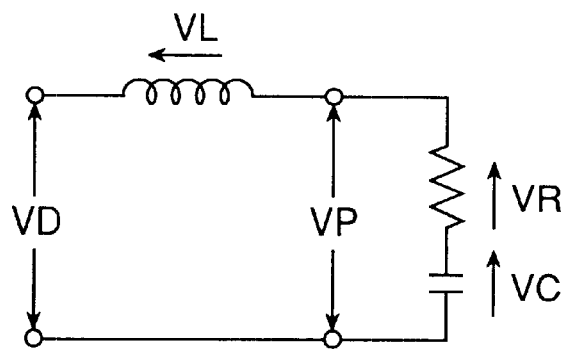
FIG. 13 is an equivalence circuit for the section from the load-side of the impedance matching circuit to the plasma load.
Figure 14:
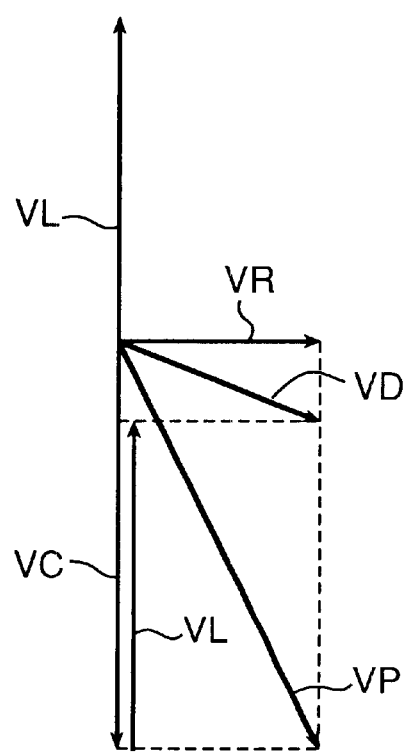
FIG. 14 is a voltage vector diagram of the equivalence circuit shown in FIG. 13.

FIG. 10 is a flow chart used to describe the algorithm of a program run by the computer of the fourth embodiment described above. Note that steps 1 to 8 in the algorithm according to the present embodiment are identical to those shown in FIG. 8, except that only the known impedance ZL* of the matcher 3 is input in step S1.

Known impedance ZL* of the known inductance L1 of the selected tap is input to the known impedance input section 24a (step S1).

The matcher input impedance calculation section 24b then reads the detected voltage V1, detected current I1, and phase difference θ1 signals output from the power side supply detector 3A (step S2). Next, the absolute value Z1of the input impedance is obtained (step S3), and the matcher input impedance Z1* is obtained (step S4).

The adjustment impedance calculation section 24c then reads the position detection signals Ep1 and Ep2 (step S5), and the capacitances C1 and C2 of the first and second variable capacitors C11 and C22 are then calculated from the position detection signals (step S6). Based on the results, the reactances XC1 and XC2 of the first and second variable capacitors C11 and C22 are then obtained (step S7).

The power line input impedance calculation section 24d then calculates the power line input impedance Z2*(step S8).

Next, the effective power calculation section 24e calculates the effective power P of the high frequency supply 1 from the detected voltage V1, detected current I1, and phase difference θ1 signals read in step S2 using the following equation (32) (step S9).

$$P = V1 \cdot I1 \cdot \cos\theta 1 \tag{32}$$

The matcher load-side terminal current and voltage calculation section 24f then calculates the terminal voltage V2* and current I2* of the matcher 3 using equations (33) and (34) assuming there is zero loss in the matcher 3 and the input impedance Z2*=R2+jX2.

$$I2^* = (P/R2)^{1/2} \tag{33}$$

$$V2^* = (P/R2)^{1/2} \cdot Z2^* \tag{34}$$

As in the second embodiment, the power line load-side current and voltage calculation section 24g treats the power line 4 as a four terminal network to calculate the load-side terminal voltage V3* and current I3* of the power line 4 from the load-side terminal voltage V2* and current I2* of the matcher 3 (step S11).

The plasma impedance calculation section 24h calculates the plasma impedance ZP* from the load-side terminal voltage V3* and current I3* of the power line 4 using equation (14) (step S12).

The peak-to-peak plasma voltage calculation section 24i then obtains the peak-to-peak plasma voltage VPP from the load terminal voltage V3* using equation (15) (step S13).

Finally, the display controller 24j then outputs a command for displaying the plasma impedance values ZP* and peak-to-peak plasma voltage VPP (step S14), and the procedure loops back to step S2.

It will be obvious that the matching circuit used in the above embodiments can be configured in many ways insofar as it is a device for input and output impedance matching, and the impedances of the circuit elements are known or can be known.

In addition, the measured impedance ZS* of the power line 4 is determined in the above embodiments using an impedance analyzer, but it can alternatively be calculated by an electromagnetic field simulator.

As will be known from the above description, a plasma monitoring apparatus according to the present invention improves the measuring precision of the impedance or peak-to-peak voltage of a plasma load, and can therefore be used as a monitoring tool with good reproducibility in semiconductor manufacturing processes.

In addition, the plasma monitoring apparatus of the invention can be used as an end point monitor for such processes as etching and ashing.

The plasma monitoring apparatus of the invention can also detect unstable, abnormal, and other discharging problems in the plasma chamber.

In addition, the plasma monitoring apparatus according to claims 1 and 3 of the invention detects voltage and current at a point near the plasma load, and can therefore minimize calculation error.

The plasma monitoring apparatus according to claims 4 and 6 of the invention detects voltage and current at a point enabling high precision detection, and can therefore further improve the precision of plasma impedance and peak-to-peak voltage measurements.

The plasma monitoring apparatus according to claims 3, 6, and 7 can also efficiently measure plasma impedance and peak-to-peak voltage without using an impedance analyzer.

Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims, unless they depart therefrom.

What is claimed is:

1. A plasma monitoring apparatus for monitoring a status of a plasma load, comprising:

a high frequency power supply for supplying high frequency power to the plasma load;

an impedance matching circuit coupled between the high frequency power supply and the plasma load, said impedance matching circuit having a load-side terminal connected to the plasma load;

a voltage detector for detecting a voltage at the load-side terminal of the impedance matching circuit;

a current detector for detecting a current at the load-side terminal of the impedance matching circuit;

a phase difference detector for detecting a difference in phase between the voltage detected by the voltage detector and the current detected by the current detector;

an input impedance calculator for calculating a first impedance at the load-side terminal of the impedance matching circuit, based upon the detected voltage, the detected current and the detected phase difference; and a plasma impedance calculator for calculating a second impedance of the plasma load, based upon both the first calculated impedance and a measured impedance of a line coupled between the load-side terminal of the impedance matching circuit and the plasma load.

2. The plasma monitoring apparatus of claim 1, further comprising a voltage calculator for calculating a peak-to-peak voltage of the plasma load based upon the second calculated impedance calculated by the plasma impedance calculator, and the current detected by the current detector.

3. A plasma monitoring apparatus for monitoring a status of a plasma load, comprising:

a high frequency power supply for supplying high frequency power to the plasma load;

an impedance matching circuit coupled between the high frequency power supply and the plasma load, said impedance matching circuit having a load-side terminal connected with the plasma load;

a voltage detector for detecting a first voltage at the load-side terminal of the impedance matching circuit;

a current detector for detecting a first current at the load-side terminal of the impedance matching circuit;

a phase difference detector for detecting a difference in phase between the first voltage detected by the voltage detector and the first current detected by the current detector;

a voltage and current calculator for calculating a second voltage and a second current at the load-side terminal of the impedance matching circuit, based upon the first detected voltage, the first detected current and the detected phase difference, and for also calculating a third voltage and a third current at a second end of a line coupled between the load-side terminal of the impedance matching circuit and the plasma load, based upon the second calculated voltage and the second calculated current; and a plasma impedance calculator for calculating an impedance of the plasma load based upon the third calculated voltage and the third calculated current.

4. A plasma monitoring apparatus for monitoring a status of a plasma load, comprising:
- a high frequency power supply for supplying a high frequency power to the plasma load;
- an impedance matching circuit coupled between the high frequency power supply and the plasma load, said impedance matching circuit having a power input terminal coupled to the power supply and a load-side terminal connected to the plasma load;
- a voltage detector for detecting a first voltage at the power input terminal of the impedance matching circuit;
- a current detector for detecting a first current at the power input terminal of the impedance matching circuit;
- a phase difference detector for detecting a difference in phase between the first voltage detected by the voltage detector and the first current detected by the current detector;
- a first impedance calculator for calculating a first input impedance at the power input terminal of the impedance matching circuit based upon the first detected voltage, the first detected current and the detected phase difference;
- a second impedance calculator for calculating a second input impedance at the load-side terminal of the impedance matching circuit based upon the first calculated input impedance and known and calculated impedances of elements forming the impedance matching circuit; and
- a plasma impedance calculator for calculating an impedance of the plasma load based upon the second calculated input impedance and a measured impedance of a line coupled between the load-side terminal of the impedance matching circuit and the plasma load.

5. The plasma monitoring apparatus of claim 4, further comprising a current calculator for calculating a second current at the load-side terminal of the impedance matching circuit based upon the first detected voltage, the first detected current and the known and calculated impedances, and a voltage calculator for calculating a peak-to-peak voltage of the plasma load based upon the second calculated impedance and the second calculated current at the load-side terminal of the impedance matching circuit.

6. A plasma monitoring apparatus for monitoring a status of a plasma load, comprising:
- a high frequency power supply for supplying high frequency power to the plasma load;
- an impedance matching circuit coupled between the high frequency power supply and the plasma load, said impedance matching circuit having a power input terminal connected to the power supply and a load-side terminal connected to the plasma load;
- a voltage detector for detecting a first voltage at the power input terminal of the impedance matching circuit;
- a current detector for detecting a first current at the power input terminal of the impedance matching circuit;
- a phase difference detector for detecting a difference in phase between the first voltage detected by the voltage detector and the first current detected by the current detector;
- a first impedance calculator for calculating a first input impedance at the power input terminal of the impedance matching circuit based upon the first detected voltage, the first detected current and the detected phase difference;
- a second impedance calculator for calculating a second input impedance at the load-side terminal of the impedance matching circuit based upon the first calculated input impedance and known and calculated impedances of elements forming the impedance matching circuit;
- an effective power calculator for calculating an effective power of the high frequency power supply based upon the first detected voltage, the first detected current and the detected phase difference;
- a first voltage and current calculator for calculating a second voltage and a second current at the load-side terminal of the impedance matching circuit, based upon the second calculated impedance and the calculated effective power; and
- a second voltage and current calculator for calculating a third voltage and a third current at a first end of a line coupled between the load-side terminal of the impedance matching circuit and the plasma load, based upon the second calculated voltage and the second calculated current; and
- a plasma impedance calculator for calculating an impedance of the plasma load based upon the third calculated voltage and the third calculated current at the first end of the line.

7. The plasma monitoring apparatus of claim 3, further comprising a voltage calculator for calculating a peak-to-peak voltage of the plasma load based upon the third calculated voltage at the first end of the line.

8. The plasma monitoring apparatus of claim 6, further comprising a voltage calculator for calculating a peak-to-peak voltage of the plasma load based upon the third calculated voltage at the first end of the line.

* * * * *